United States Patent [19]
Raleigh et al.

[11] Patent Number: 6,158,041
[45] Date of Patent: Dec. 5, 2000

[54] SYSTEM AND METHOD FOR I/Q TRELLIS CODED MODULATION

[75] Inventors: Gregory G. Raleigh, El Granada; Michael A. Pollack, Cupertino; Vincent K. Jones, Redwood Shores; Richard Dale Wesel, Manhattan Beach, all of Calif.

[73] Assignee: Cisco Technology, San Jose, Calif.

[21] Appl. No.: 09/172,989

[22] Filed: Oct. 14, 1998

[51] Int. Cl.$^7$ ............... H03M 13/23; H03M 13/41
[52] U.S. Cl. ............... 714/792; 714/786; 714/788; 714/790; 714/795
[58] Field of Search .................... 714/786, 788, 714/790, 795, 792

[56] References Cited

U.S. PATENT DOCUMENTS

| | | | |
|---|---|---|---|
| 4,881,241 | 11/1989 | Pommier et al. | 375/38 |
| 5,555,547 | 9/1996 | Lemaitre et al. | 375/262 |
| 5,903,546 | 5/1999 | Ikeda et al. | 370/232 |
| 5,970,047 | 10/1999 | Suzuki | 370/210 |

OTHER PUBLICATIONS

Wesel et al., "Trellis Code Design for Periodic Interleavers", IEEE Communication Letters.
Al–Semari et al., "I–Q TCM: Reliable Communication Over the Rayleigh Fading Channel Close to the Cutoff Rate", Jan. 1, 1997, IEEE Transactions on Information Theory, vol. 43, No. 1.
Keil et al., "P$^2$ Codes: Pragmatic Trellis Codes Utilizing Punctured Convolutional Codes", Feb. 1995, IEEE Communications Magazine, pp. 94–99.
Wesel et al., "Periodic Symbol Puncturing of Trellis Codes", Nov. 1997, 31$^{st}$ Asilomar Conference on Signals, Systems and Computers.
Richard D. Wesel, "Trellis Code Design for Correlated Fading and Achievable Rates for Tomlinson–Harashima Precoding", 1996, Ph.D. Dissertation at Stanford University.
Wesel et al., "Joint Interleaver and Trellis Code Design", Nov. 3–8, 1997, in proceedings of Globecom 97, Pheonix, AZ.
Wesel et al., "Fundamentals of Coding for Broadcast OFDM", Oct. 30, 1995, in Twenty–Ninth Asilomar Conference on Signals, Systems and Computers.
Leung et al., "Multifrequency Trellis Coding with Low Delay for Fading Channels", Oct. 1993, IEEE Trans. On Comm., 41(10), pp. 1450–1459.

*Primary Examiner*—Stephen M. Baker
*Attorney, Agent, or Firm*—Ritter, Van Pelt & Yi LLP

[57] ABSTRACT

A high performance system and method for trellis coded modulation are provided by virtue of the present invention. In one embodiment, the trellis coded modulation technique optimizes code performance for a given implementation cost. Also, this trellis coded modulation technique provides optimal performance in the context of periodic symbol deletion, whether this deletion is due to intentional puncturing, the use of interleaving in the presence of fading, or the use of interleaving in an OFDM system used to communicate across a frequency-selective channel.

29 Claims, 9 Drawing Sheets

CODE 1 PUNCTURE PATTERNS

RATE 1/2: 1 1 0 1 1 1 0 1 0

RATE 3/4: 1 0 1 0 1 0 1 0 0

*FIG. 5A*

CODE 2 PUNCTURE PATTERNS

RATE 1/2: 1 1 1 0 1 1 1 0 0

RATE 3/4: 1 0 1 0 1 0 1 0 0

*FIG. 5B*

| $D_1$ | $D_2$ | $D_3$ | $D_4$ | $D_5$ | $D_6$ | $D_7$ | $D_8$ | $D_9$ |
|---|---|---|---|---|---|---|---|---|
| $D_{10}$ | $D_{11}$ | $D_{12}$ | $D_{13}$ | $D_{14}$ | $D_{15}$ | $D_{16}$ | $D_{17}$ | $D_{18}$ |
| $D_{19}$ | $D_{20}$ | $D_{21}$ | $D_{22}$ | $D_{23}$ | $D_{24}$ | $D_{25}$ | $D_{26}$ | $D_{27}$ |
| $D_{28}$ | $D_{29}$ | $D_{30}$ | $D_{31}$ | $D_{32}$ | $D_{33}$ | $D_{34}$ | $D_{35}$ | $D_{36}$ |
| $D_{37}$ | $D_{38}$ | $D_{39}$ | $D_{40}$ | $D_{41}$ | $D_{42}$ | $D_{43}$ | $D_{44}$ | $D_{45}$ |
| $D_{46}$ | $D_{47}$ | $D_{48}$ | $D_{49}$ | $D_{50}$ | $D_{51}$ | $D_{52}$ | $D_{53}$ | $D_{54}$ |
| $D_{55}$ | $D_{56}$ | $D_{57}$ | $D_{58}$ | $D_{59}$ | $D_{60}$ | $D_{61}$ | $D_{62}$ | $D_{63}$ |

*FIG. 6*

SYSTEM AND METHOD FOR I/Q TRELLIS CODED MODULATION

BACKGROUND OF THE INVENTION

This invention relates to error correcting coding, and in particular to techniques for trellis coded modulation.

Many modem communication systems use error correcting coding techniques to improve the reliability of data communication. Forward error correcting codes allow a receiver to identify and correct certain transmission errors. In some instances, the judicious use of error correcting codes on a given transmission channel may allow the use of higher order modulation techniques, thereby effectively increasing the net data throughput. Error correcting coding techniques (e.g., convolutional and block codes) are described in numerous references that are readily available in the art.

Recently, a variety of techniques known as trellis coded modulation have become popular. Trellis coded modulation combines modulation and coding, whereby the redundancy added by the error correcting code does not increase the symbol rate but rather increases the size of the modulation "alphabet". In a typical trellis coded modulation designed for additive white Gaussian noise channel, some lesser significant bits of the binary code corresponding to a modulation state are coded with a convolutional code while more significant bits are left uncoded. For such a system, the coded bits determine a particular one of several subsets of modulation symbol constellation points, while the uncoded bits select a particular point in the subset. The uncoded bits thus select a quadrant in the modulation constellation while the coded bits select a particular point within the quadrant. The particular point corresponds to the modulation symbol for that set of coded and uncoded bits.

The typical trellis coded modulation technique described above provides improvement by significantly increasing the Euclidean distance between points in a subset (through error correcting coding), which results in greater immunity to noise for the uncoded bits. In fact, the Euclidean distance between points in the subset is significantly greater than the distance between points in the original (uncoded) constellation. For this reason, convolutional codes are typically selected for trellis coded modulation based on maximizing the free Euclidean distance of the code. However, convolutional codes optimized in this manner may not perform well on a transmission channel subject to fading, wherein an entire modulation symbol may be erased.

The convolutional codes used for trellis coded modulation provides improvement at a cost. Convolutional codes generate a significant amount of redundant data that are used to perform error detection and correction. For a given transmission rate, the redundancy effectively decreases the data throughput rate. To increase the fraction of the transmitted bits that represent useful data (or alternatively, to reduce the amount of added redundancy) a technique called puncturing can be used. In a punctured code, some bits in the coded bit stream are systematically removed (or punctured) prior to transmission, in accordance with a puncturing pattern, to reduce the number of transmitted bits. At the decoder, the removed bits are flagged as "erasures" and decoded accordingly.

Erasures reduce the error correcting capability of the code and result in less coding gain. However, puncturing increases the code rate and permits the use of a simple, low code rate decoder for decoding various higher code rates. The use of punctured codes in a trellis coded modulation system is described by J. Wolf and E. Zehavi in "P2 Codes: Pragmatic Trellis Codes Utilizing Punctured Convolutional Codes", IEEE Communications Magazine, vol. 33, February 1995, pp. 94–99, which is incorporated herein by reference. However, punctured codes may not perform well on a transmission channel subject to fading, wherein an entire modulation symbol may be erased.

The characteristics of the transmission channel dictate, in part, the design of a forward error correcting coding scheme. Certain transmission channels are subject to significant fading due to multipath. Multipath results from receiving multiple (and possibly distorted) copies of the transmitted signal that can add constructively or destructively to cause fading. For these channels, entire modulation symbols may be obliterated. In some cases, relatively long sequences of symbols may be obliterated. For example, the channel may be subject to periodic interference or, in the case of mobile cellular applications, multipath fading may cause the receiver to lose the receive signal for short periods of time. As another example, in orthogonal frequency division multiplexing (OFDM) systems, portions of a frequency band may be lost due to frequency selective fading.

To combat fading, interleaving is typically used to disperse (or spread out) the deleted symbols. Through interleaving, a sequence of adjacent symbols is reordered into a periodic or otherwise separated symbol sequence. However, interleaving can result in a received signal where symbols may be periodically deleted due to, e.g., a burst of errors at the interleaver input.

Interleaving can make the deletion of adjacent symbols by the channel appear like periodic symbol deletion and puncturing results in intentional deletion of symbols. Unfortunately, for conventional convolutional codes (e.g., those optimized to maximize free Euclidean distance), the interaction of these effects can seriously degrade performance.

Another concern is the implementation of trellis coded modulation receivers. High performance codes generally require very complex decoders, raising system cost.

SUMMARY OF THE INVENTION

A high performance system and method for trellis coded modulation are provided by virtue of the present invention. In one embodiment, the trellis coded modulation technique optimizes code performance for a given implementation cost. Also, this trellis coded modulation technique provides optimal performance in the context of periodic symbol deletion, whether this deletion is due to intentional puncturing, the use of interleaving in the presence of fading, or the use of interleaving in an OFDM system used to communicate across a frequency-selective channel.

A coding system may apply convolutional coding separately to in-phase ("I") and quadrature ("Q") components of the modulation signal. The encoder design is optimized for performance in the presence of periodic symbol deletion. In one embodiment, a symbol puncturer performs intentional periodic deletion of symbols.

According to a first aspect of the present invention, a system for providing trellis coded modulation to improve transmission via a channel includes a convolutional coding system that produces a stream of trellis coded modulation symbols responsive to an input data stream. A first portion of said input data stream is encoded according to a convolutional code to form in-phase components of said trellis coded modulation symbols. A second portion of said input data stream is encoded according to said convolutional code to form quadrature components of said trellis coded modulation symbols. The convolutional code is chosen to optimize performance when said trellis coded modulation symbols are subject to periodic deletion.

According to a second aspect of the present invention, a method for providing trellis coded modulation to improve transmission via a channel includes: encoding a first portion of an input data stream to provide an inphase coded data steam and a second portion of an input data stream to provide a quadrature coded data stream according to a convolutional code, and developing modulation symbols based on said inphase coded data stream and said quadrature coded data stream. The convolutional code is chosen to optimize performance when said modulation symbols are subject to periodic deletion.

According to a third aspect of the present invention, a system for decoding a trellis coded modulation signal includes: a PAM soft decision system that estimates in-phase and quadrature components of trellis coded modulation symbols, and a Viterbi decoder system that removes a convolutional code applied independently to said in-phase and quadrature components. The convolutional code is chosen to optimize performance when said trellis coded modulation symbols are subject to periodic deletion.

A further understanding of the nature and advantages of the inventions herein may be realized by reference to the remaining portions of the specification and the attached drawings.

BRIEF DESCRIPTION OF THE DRAWINGS

FIGS. 5a and 5b depict puncturing patterns for the convolutional encoders shown in FIGS. 3a and 3b, respectively, according to one embodiment of the present invention.

FIG. 6 depicts a diagram of an interleaver used to reorder (or scramble) the transmission order of modulation symbols according to one embodiment of the present invention.

DETAILED DESCRIPTION OF SPECIFIC EMBODIMENTS

Communication System

Figure 1:
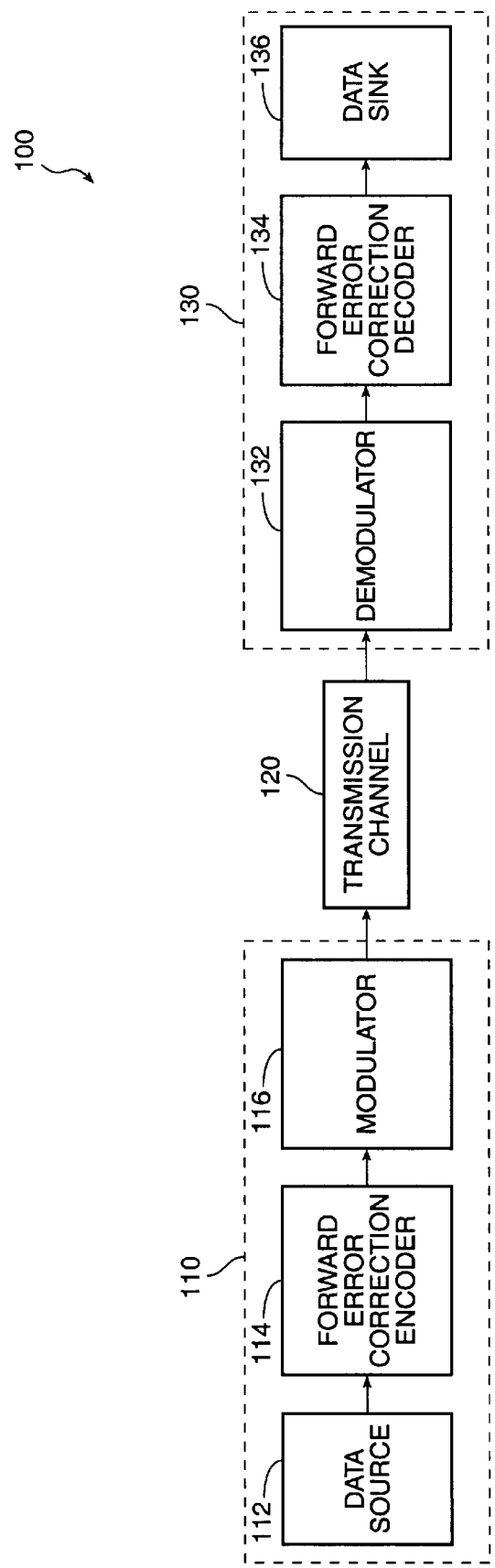
FIG. 1 depicts a block diagram of a data communication system.

FIG. 1 depicts a block diagram of a data communication system 100. Within a transmitter 110, a data source 112 provides data to a forward error correction (FEC) encoder 114. Encoder 114 encodes the data using a suitable FEC code and provides the coded data to a modulator 116. Modulator 116 modulates the coded data into a form suitable for transmission over a transmission channel 120.

The modulated signal is transmitted over transmission channel 120 and received by a receiver 130. Within receiver 130, a demodulator 132 demodulates the received signal and provides the demodulated signal to a forward error correction decoder 134. Decoder 134 decodes the demodulated signal and provides the decoded data to a data sink 136.

Generally, a data communication system is characterized by the nature of the transmission channel. For example, transmission channel 120 can be a satellite channel, a terrestrial microwave channel, a voiceband telephone channel, or other channels. Transmission channel 120 can also be, for example, a magnetic storage channel (such as a disk drive). The characteristics of the transmission channel dictate some of the choices and tradeoffs of the coding and modulation techniques to be applied.

Transmission channels are subject to noise and other impairments that can cause data errors upon demodulation. The characteristics of the transmission channel determine the characteristics of the data errors, which in turns dictate the choice of FEC codes. For example, certain communication channels are subject to significant fading due to multipath. For these channels, entire modulation symbols may be obliterated. In some instances, relatively long sequences of symbols may be obliterated. For example, the transmission channel may be subject to periodic interference or, in the case of mobile cellular applications, multipath fading may cause the receiver to lose the receive signal for short periods of time. As another example, in OFDM systems, a frequency band may be lost due to frequency selective fading, thereby obliterating symbols communicated through this band.

To combat error bursts, some form of symbol interleaving is typically used to disperse the bursts of symbol errors so that the decoder is not overwhelmed with successive errors. In one embodiment, an interleaver reorders the symbols such that adjacent symbols at the interleaver input map into a periodic symbol sequence at the interleaver output. On the receive side, a deinterleaver effectively reverses the interleaving process. In this embodiment, a burst of errors at the deinterleaver input results in periodic errors at the deinterleaver output.

Figure 2:
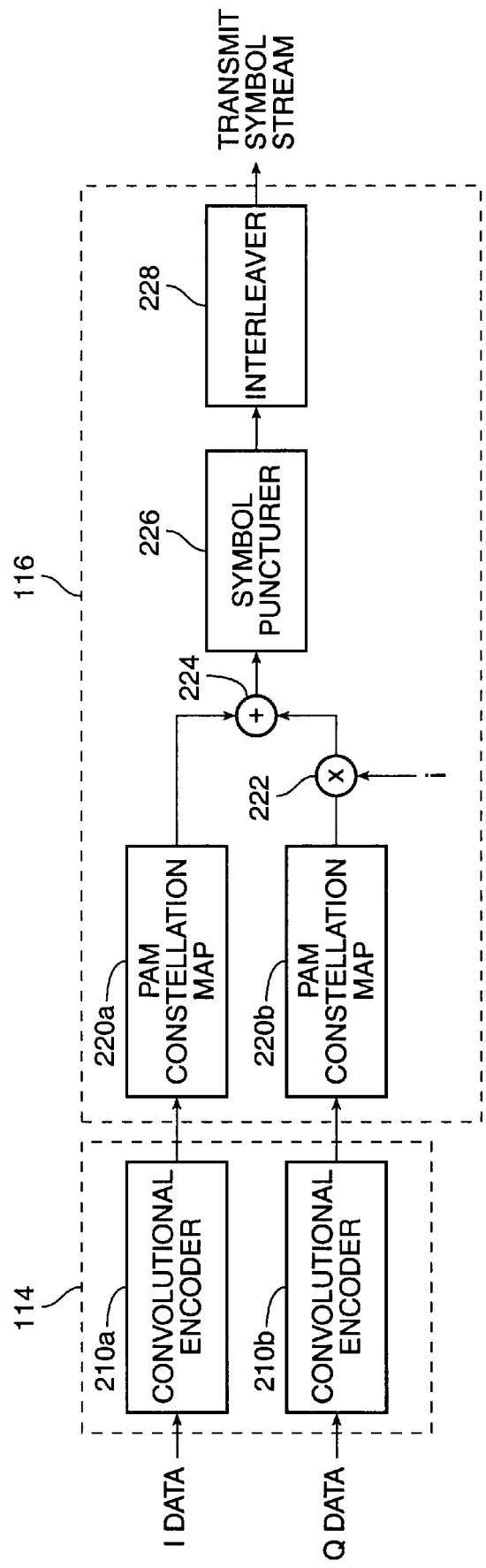
FIG. 2 depicts a block diagram of one embodiment of an encoder and a modulator according to one embodiment of the present invention.

The remaining discussion is directed toward the operation of the encoding and modulation stages and corresponding decoding and demodulation stages. FIG. 2 depicts a block diagram of one embodiment of encoder 114 and modulator 116. Data from data source 112 is partitioned into two parallel data streams, an I data stream and a Q data stream (e.g., corresponding to the inphase and quadrature components of a quadrature amplitude modulation (QAM) signal). In the embodiment shown in FIG. 2, each data stream is provided to a convolutional encoder 210 which encodes the data stream in accordance with a predetermined convolutional code selected for the system. The coded bits from each encoder 210 are provided to a pulse amplitude modulation (PAM) constellation map element 220 that partitions the coded bits into sets of bits and maps each set into a PAM symbol. The PAM symbols from map element 220b are provided to a multiplier 222 that multiplies the PAM symbols with a complex value "i" to provide quadrature PAM symbols.

The inphase PAM symbols from map element 220a and the quadrature PAM symbols from multiplier 222 are provided to a summer 224 that combines the inphase and quadrature PAM symbols to form complex QAM symbols. The output from summer 224 is provided to a symbol puncturer 226 that selectively punctures (i.e., deletes or removes) selective QAM symbols. The output from symbol puncturer 226 is provided to an interleaver 228 that reorders the QAM symbols in a predetermined order. Map elements 220, symbol puncturer 226, and interleaver 228 are further described below.

Conventionally, the FEC codes are designed in accordance with a metric. One such metric is a free Euclidean distance of the FEC code. A convolutional code (one class of FEC codes) can be selected based on maximizing the free Euclidean distance of the code. However, a convolutional code based solely on this metric can be sub-optimal when the received signal contains periodic errors. Periodic errors can be generated, e.g., by the operation of deinterleaver 228 during an error burst caused by the transmission channel, by the operation of deinterleaver 228 within an OFDM system where the transmission channel exhibits frequency selective fading, by systematic puncturing of the QAM symbols, for example, by symbol puncturer 226, or by some combination of these effects.

In one embodiment, a convolutional code is selected that is optimized for performance in the presence of periodic symbol deletion. Design of codes for periodic symbol deletion is discussed in R. D. Wesel, X. Liu, and W. Shi, *Periodic Symbol Puncturing of Trellis Codes*, 31$^{st}$ Asilomar Conference on Signals, Systems, and Computers, November 1997, the contents of which are herein incorporated by reference.

As alternatives to free Euclidean distance, two other useful metrics in code design are product distance and periodic product distance. The product distance of a symbol error sequence is the product of the squared distance of each symbol error in the sequence. Product distance is found to be an effective code design metric when the communication channel randomly corrupts entire symbols due to fading or other non-Gaussian noise impairments. Periodic product distance is defined in a similar fashion except that it is appropriate for the case when the total or substantial loss of entire symbols occurs in a periodic fashion. Specifically, the periodic product distance may be defined in terms of a periodic distance vector. The periodic distance vector has length equal to the symbol corruption period. Each element in said periodic distance vector is the sum of the squared Euclidean distance seen by symbols in the corresponding phase of the period. The periodic product distance is the product of the nonzero elements of the periodic distance vector. Optimizing the periodic product distance of a trellis code is described in detail in a paper by R. Wesel entitled "Trellis Code Design for Correlated Fading and Achievable Rates for Tomlinson-Harashima Precoding," Ph.D. Dissertation, Stanford University, August 1996, the contents of which are herein incorporated by reference.

In one embodiment, each of the I and Q streams are independently encoded by a suitably selected convolutional code. This procedure, known as I-Q TCM, is highly advantageous in that good error correcting performance is available with much lower complexity than standard (2-dimensional) TCM. This reduction in complexity comes from the fact that I-Q TCM utilizes two separate decoders that are each exponentially less complex than their combination. For example, the complexity of two $\frac{2}{3}$ decoders (I-Q TCM) is much less than one $\frac{4}{6}$ decoder (TCM). Reduced complexity of I-Q TCM can be exchanged for higher data rate designs and better performance codes (higher constraint length). Therefore, for the same level of complexity, I-Q TCM systems will offer better performance than available with conventional TCM. Alternatively, for the same performance, the I-Q TCM systems will be less complex. I-Q TCM systems are described by Al-Semari, S. A. and Fuja, T. E. in "I-Q TCM: Reliable Communication Over the Rayleigh Fading Channel Close to the Cutoff Rate," IEEE Transactions on Information Theory, vol.43, (no.1), IEEE, January 1997. p.250–62, the contents of which are herein incorporated by reference.

Figure 3A:
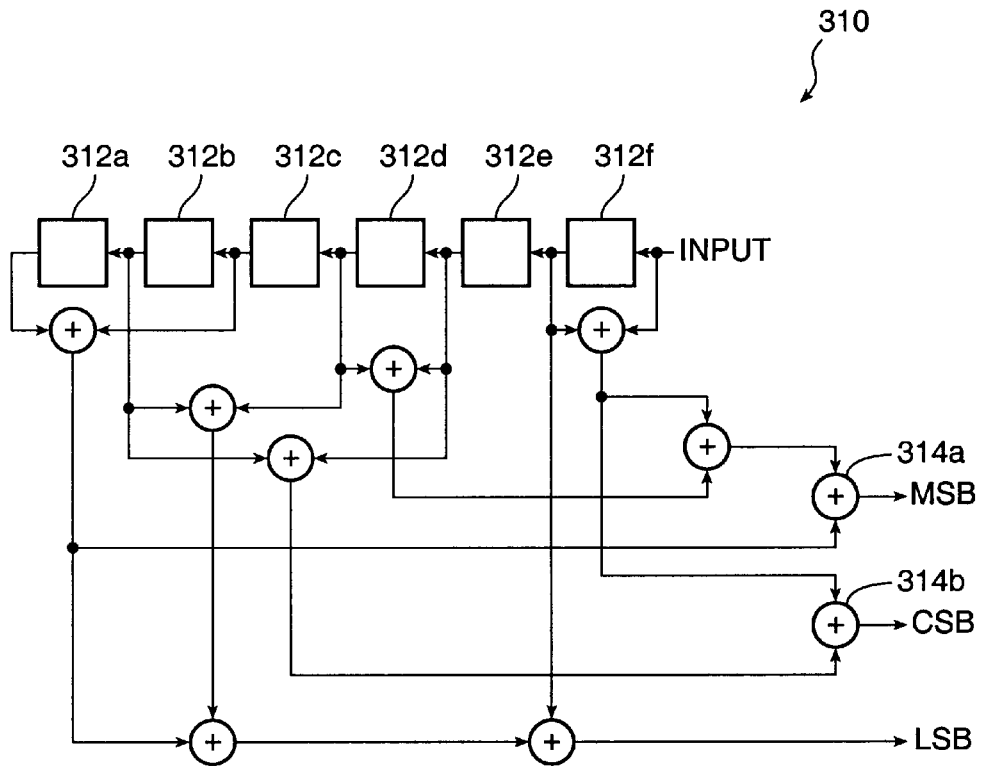
FIGS. 3a and 3b depict diagrams of two convolutional encoders according to one embodiment of the present invention.

FIG. 3a depicts a diagram of one embodiment of a convolutional encoder 310. In encoder 310, the data bits are shifted into the encoder as shown, one bit at a time, while the contents of shift registers 312 are shifted to the left. At each bit time, adders 314a, 314b, and 314c compute coded bits labeled MSB (Most Significant Bit), CSB (Center Significant Bit), and LSB (Least Significant Bit), respectively. Thus, for each input data bit, encoder 310 produces three coded bits.

The design of convolutional encoder 310 may be characterized by numbers referred to as generators. The three generators for encoder 310 are designated as 172 (octal) for the LSB, 47 (octal) for the CSB, and 137 (octal) for the MSB. Encoder 310 has a connection to an adder from a given point in encoder shift register 312 if a generator, expressed in binary, has a "1" at that point. For example, the MSB generator for encoder 310 is 137 (octal), or 1011111 (binary), which signifies that the MSB of the encoder output is the (modulo-2) sum of bits 1, 3, 4, 5, 6, and 7 (counting from the left).

Figure 3B:
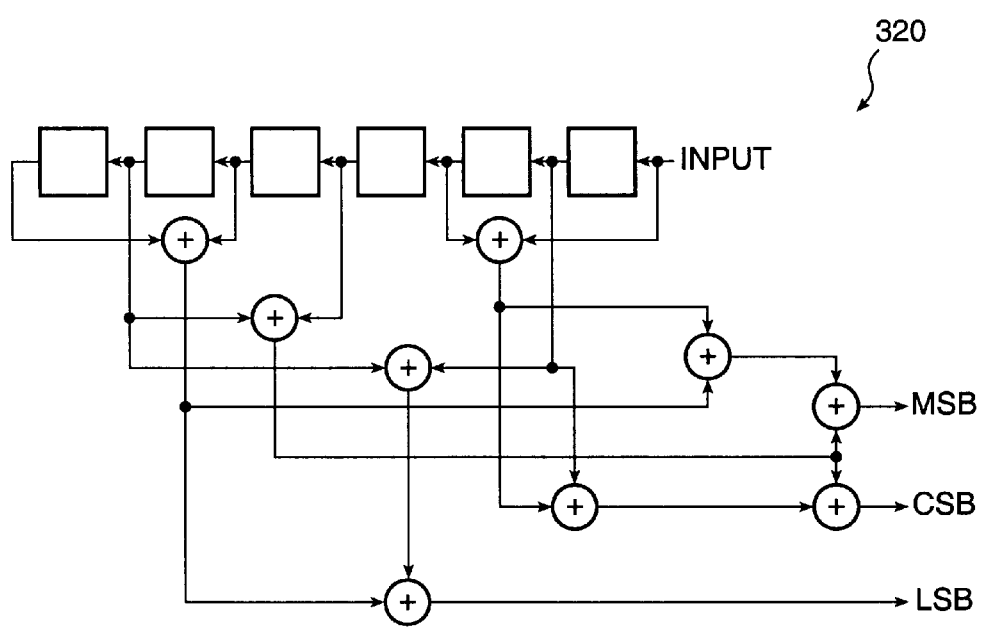

FIG. 3b depicts a diagram of an alternative embodiment of a convolutional encoder 320. Encoder 320 operates in a manner similar to encoder 310. However, the generators for the MSB, CSB, and LSB are 162 (octal), 57 (octal), and 175 (octal), respectively.

The convolutional coders of FIGS. 3A–3B represent alternatives usable to implement convolutional encoder 210a and convolutional encoder 210b. Each encoder has rate $\frac{1}{3}$, i.e., they generate 3 output bits for each input bits. The designs of the convolutional coders are only particular examples that have been found to have good performance in the presence of periodic symbol deletion. Many other designs may also be used according to the present invention.

Modulation Symbols

Figure 4A:
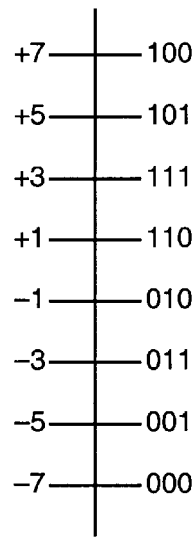
FIG. 4a depicts a diagram of an 8-level pulse amplitude modulation (PAM) constellation map according to one embodiment of the present invention.

FIG. 4a depicts a diagram of an 8-level PAM constellation map used to modulate the coded I and Q data. In FIG. 4a, a vertical axis represents the amplitude of the modulated PAM pulse. The normalized amplitude values are shown to the left of the vertical axis and range from +7 to −7. The horizontal hashes across the vertical axis represent the eight possible transmitted PAM values for the 8-PAM system. The 3-bit value identifying each PAM state is shown to the right of each corresponding PAM value. For example, the PAM state of "100" corresponds to a PAM value of +7. In the embodiment shown in FIG. 4a, the particular assignment of 3-bit values to the 8-PAM constellation is known as Gray coding, which is characterized by the 3-bit values of adjacent PAM states differing in only one bit position. Any symbol mapping scheme may be used in accordance with the present invention.

Figure 4B:
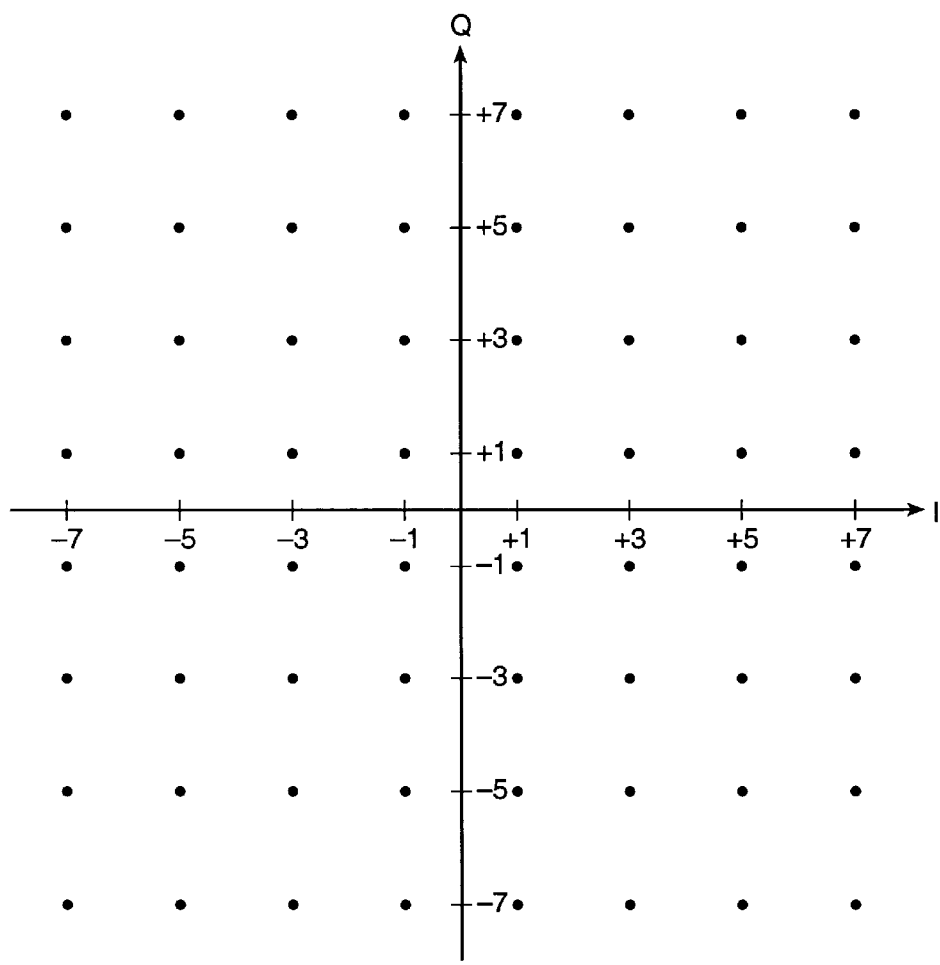
FIG. 4b depicts a diagram of a 64-level quadrature amplitude modulation (QAM) constellation map according to one embodiment of the present invention.

FIG. 4b depicts a diagram of a 64-level QAM constellation map. Referring to FIG. 2, the Q PAM symbols are multiplied by the complex value "i", by multiplier 222, and added to the I PAM symbols, by summer 224. These operations create a complex (baseband) QAM symbol. Thus, each pair of I and Q PAM symbols can be represented by a particular point (or dot) in the QAM constellation map shown in FIG. 4b. Each point, in turn, specifies a particular amplitude and phase of a modulating carrier.

Puncturing

The convolutional encoding process generates a significant amount of redundant data such that the amount of data from each encoder can be significantly more than the amount of original data being encoded. In fact, for rate ⅓ encoders as shown in FIGS. 3a and 3b, three coded bits are generated for each data bit.

To reduce the amount of redundant information provided by the convolutional encoders, a technique known as puncturing can be used. Puncturing involves systematic deletion (or puncturing) of some coded bits (or coded symbols) in the coded data stream. Puncturing reduces the amount of transmitted overhead (thereby increasing the effective data rate for a given transmitted symbol rate) but simultaneously reduces the correction power of the convolutional code. Puncturing also allows a higher rate code (e.g., rate ¾) to be decoded with a simple decoder designed for a lower rate code (e.g., rate ⅓). In the depicted embodiment, periodic puncturing of symbols is used.

FIGS. 5a and 5b depict puncturing patterns usable with convolutional encoders 310 and 320, respectively. Each of FIGS. 5a and 5b depicts puncturing patterns to achieve a rate ½ and a rate ¾ encoder based on a rate ⅓ code design. In each of the puncturing patterns, a "1" signifies that the coded symbol is passed on to the transmitted symbol stream, while a "0" signifies that the corresponding coded symbol is eliminated (or punctured) from the transmitted symbol stream. Each of these puncturing patterns has a puncture period of nine, which means that each puncturing pattern is applied to a set of nine coded symbols from summer 224. The nine coded symbols represent data that if not coded would be represented by three symbols. The rate ½ puncture patterns preserve six of the nine coded symbols. The resulting rate is thus ⅜ or ½. The rate ¾ puncture patterns preserve four of the nine coded symbols, resulting in a rate of ¾.

Interleaving

FIG. 6 depicts a diagram of an interleaver used to reorder (or scramble) the transmission order of the QAM symbols. Interleaving ensures that bursts of adjacent symbol errors induced by the transmission channel are dispersed (or spread out) before the decoding process, thereby improving the performance of the decoder. This dispersion allows for correction of error events that might otherwise be uncorrectable.

The interleaver shown in FIG. 6 is a matrix of M rows and L columns. In one embodiment, the data to be interleaved is written into the matrix by rows, as shown, and the interleaved data is read out of the matrix by columns. The effects of this read and write order are that adjacent symbols in the input data stream are separated by L symbol positions in the interleaved data stream. For example, for the interleaver shown in FIG. 6, the input symbol order is D1, D2, D3, D4, and so on, while the output (interleaved) symbol order is D1, D10, D19, . . . D55, D2, D11, and so on. The output of the interleaver is a (complex baseband) QAM symbol stream that is then modulated onto a carrier for transmission.

The parameter L is referred to as the interleaver depth. For the interleaver shown in FIG. 6, the interleaver depth is nine.

In one embodiment, the interleaver depth is selected to correspond to the number of unpunctured symbols per puncturing period. Thus, for the convolutional encoders shown in FIGS. 3a and 3b and the corresponding puncturing patterns shown in FIGS. 5a and 5b, the interleaver depth is nine for the unpunctured code (e.g., rate ⅓), six for the rate ½ code, and four for the rate ¾ code. Optimizing the periodic product distance (PPD) of the punctured code yields a robust system performance against Rayleigh fading in this embodiment. See R. Wesel, "Trellis Code Design for Correlated Fading and Achievable Rates for Tomlinson-Harashima Precoding", Ph.D. Dissertation, Stanford University, August 1996.

For certain channels, setting the interleaver depth L equal to the number of unpunctured symbols per puncture period may not provide optimal performance. The puncture pattern and interleaver combination should be selected to provide the requisite performance for a given transmission channel.

Receiver

Figure 7:
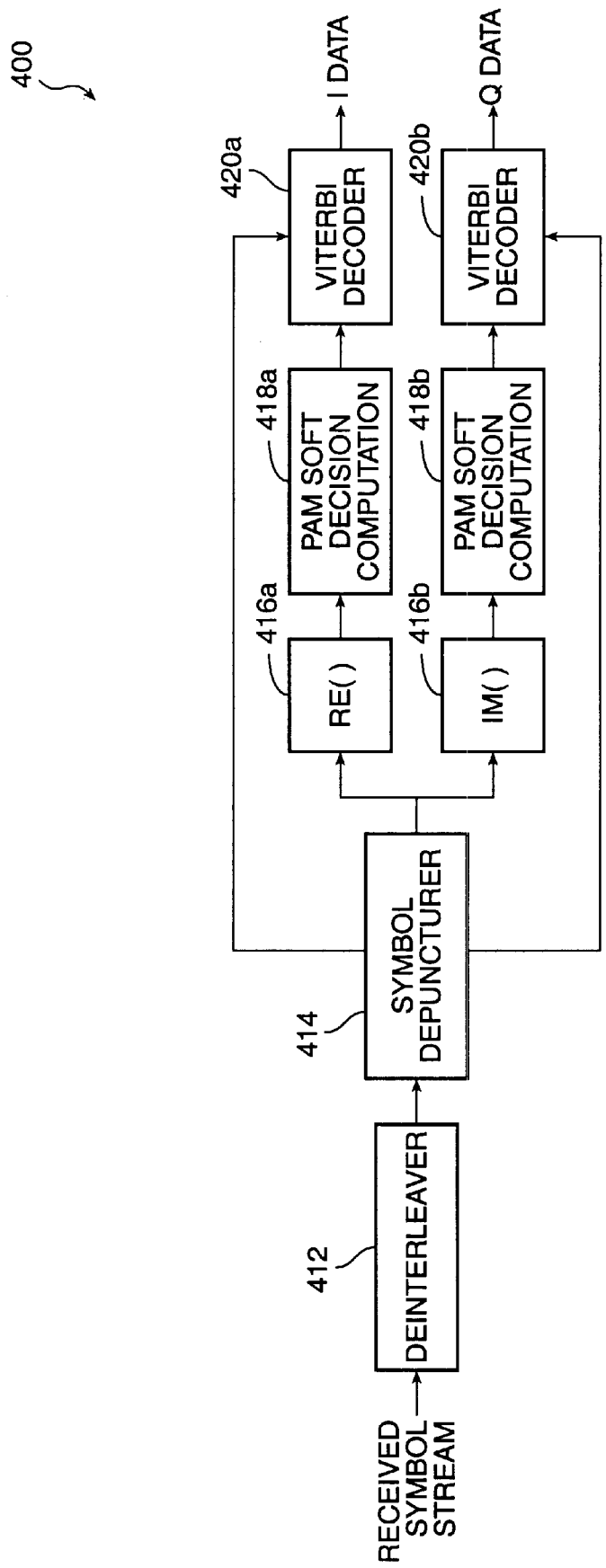
FIG. 7 depicts a block diagram of one embodiment of a demodulator and decoder according to the present invention.

FIG. 7 depicts a block diagram of one embodiment of a demodulator and decoder. A stream of (complex baseband) QAM symbols is received from the demodulator and provided to a deinterleaver 412. Deinterleaver 412 reorders the QAM symbols in the inverse (or complementary) order as that performed by interleaver 228. Thus, the QAM symbols are written into the matrix by column and read out by rows. Deinterleaver 412 provides the deinterleaved symbols (in their original order) to a symbol depuncturer 414.

Symbol depuncturer 414 synchronizes the puncture pattern and generates flags to a subsequent Viterbi decoder 420 to indicate the locations of punctured symbols. Symbol depuncturer 414 can add "dummy" symbols (or erasures) into the data stream to indicate the punctured symbols. In one embodiment, the data is transmitted in frames (e.g., there are a predetermined number of symbols per frame), and frame synchronization is performed by a system synchronization circuit (not shown in FIG. 7). In this embodiment, the synchronization of the punctured patterns is straightforward.

Symbol depuncturer 414 provides the depunctured QAM symbol stream to a real part extractor 416a and an imaginary part extractor 416b. Extractors 416a and 416b process the (complex baseband) QAM symbols into respective inphase I symbol stream and quadrature Q symbol stream, each stream consisting of PAM symbols. The inphase PAM symbols can be derived by taking the real part of the complex QAM symbols while the quadrature PAM symbols can be derived by taking the imaginary part of the complex QAM symbols. The I and Q symbol streams are provided to PAM soft decision computation elements 418a and 418b, respectively.

Computation elements 418a and 418b compute the soft decisions for each PAM symbol. Computation elements 418 generate eight soft decisions for each received PAM symbol, with each soft decision representing the log likelihood of each of the eight possible PAM symbols being the correct symbol. In one embodiment, the soft decision metric for each of the eight possible PAM constellation states is computed on the basis of the squared Euclidean distance between the actual received symbol value and the ideal constellation value. In addition, for receivers that have some channel state information, that information can be used in the soft decision metric calculation. The soft decisions from computation elements 418a and 418b are provided to Viterbi decoders 420a and 420b, respectively.

Viterbi decoders 420 perform maximum-likelihood Viterbi algorithm decoding of the symbol soft decisions. The detailed operation of the Viterbi algorithm is documented by Stephen B. Wicker in "Error Control Systems for Digital Communication and Storage", Prentice Hall, 1995, which is incorporated herein by reference. In one embodiment, for punctured symbols, all eight soft decision metrics are set to "0". Viterbi decoders 420a and 420b provide the decoded I and Q data bit streams, respectively.

Alternative Architecture

Figure 8:
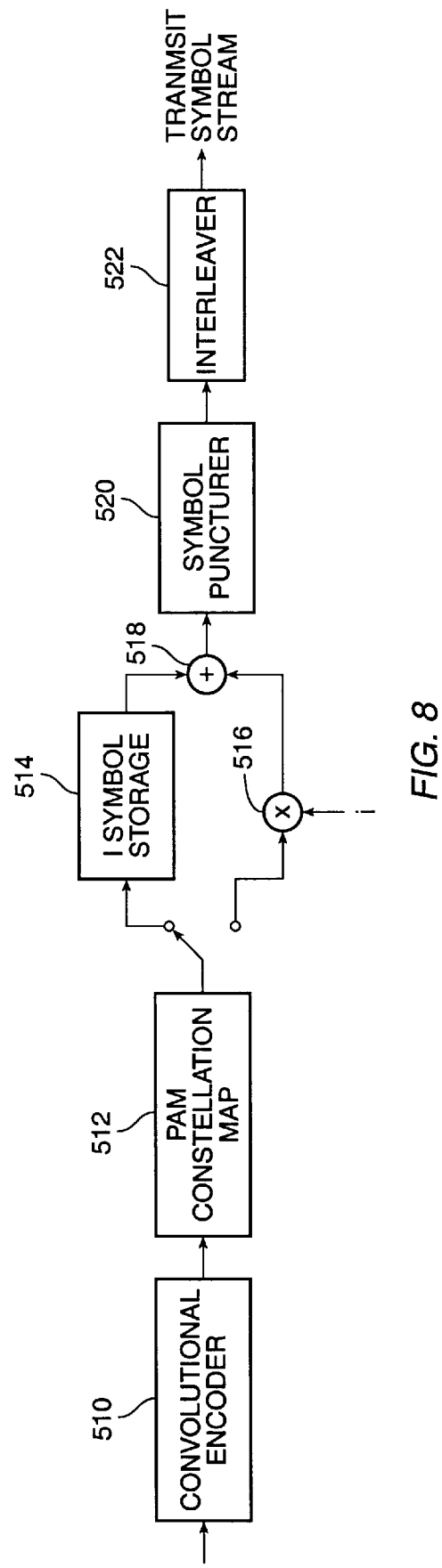
FIG. 8 depicts another embodiment of a transmitter according to the present invention.

FIG. 8 depicts another embodiment of a transmitter. Within transmitter 500, the input data is partitioned into frames and provided to a convolutional encoder 510. Encoder 510 encodes the data with a suitable convolutional code and provides the coded data to a PAM constellation map element 512. Map element 512 maps the coded bits into PAM symbols, in a similar manner to that performed by map elements 220 in FIG. 2. In one embodiment, the first half frame of PAM symbols (which will become the I symbols) is provided to a symbol storage element 514. The PAM symbols for the second half of the frame (the Q symbols) are generated and provided to a multiplier 516 that multiplies the Q symbols with the imaginary value "i". The I symbols from storage element 514 and the corresponding Q symbols from multiplier 516 are provided to a summer 518 that sums the symbol pairs to generate complex QAM symbols. The QAM symbols are provided to a symbol puncturer 520 that punctures the QAM symbols and provides the punctured symbols to an interleaver 522. Symbol puncturer 520 and interleaver 522 perform in similar manner as symbol puncturer 226 and interleaver 228, respectively, which are described above.

Figure 9:
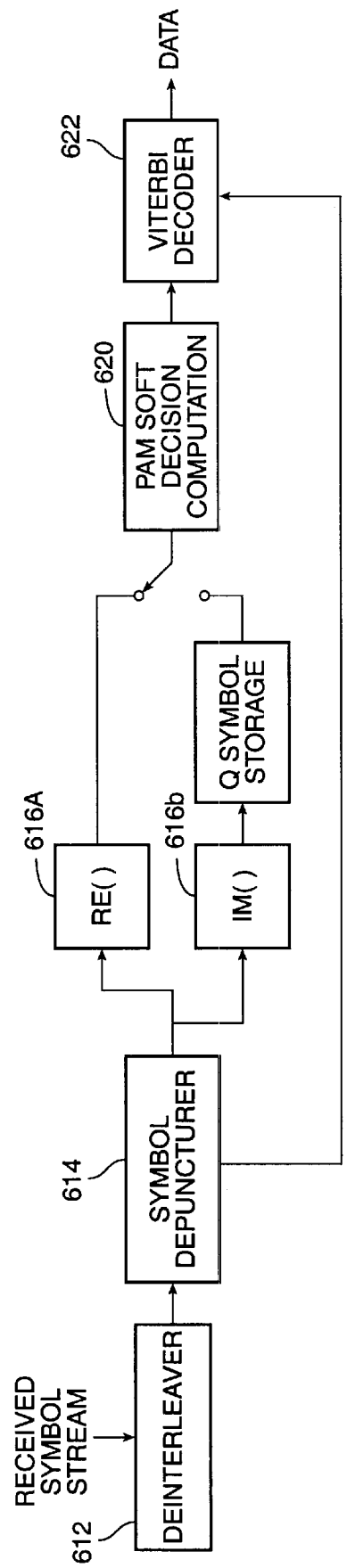
FIG. 9 depicts a block diagram of a receiver corresponding to the transmitter shown in FIG. 8 according to one embodiment of the present invention.

FIG. 9 depicts a block diagram of a receiver 600 corresponding to transmitter 500 shown in FIG. 8. A stream of (complex baseband) QAM symbols is received from a demodulator and provided to a deinterleaver 612. Deinterleaver 612 reorders the symbols in the inverse (or complementary) order as that performed by interleaver 522. Deinterleaver 612 provides the deinterleaved symbols (in their original order) to a symbol depuncturer 614.

Symbol depuncturer 614 synchronizes the puncture pattern and generates flags to a subsequent Viterbi decoder 622 to indicate the locations of punctured symbols. Symbol depuncturer 614 can add "dummy" symbols (or erasures) into the data stream to replace the punctured symbols. Symbol depuncturer 614 provides the depunctured QAM symbol stream to a real part extractor 616a and an imaginary part extractor 616b. Extractors 616a and 616b process the complex QAM symbols into respective inphase I symbol stream and quadrature Q symbol stream, each stream consisting of PAM symbols. The inphase PAM symbols can be derived by taking the real part of the complex QAM symbols while the quadrature PAM symbols can be derived by taking the imaginary part of the complex QAM symbols.

The Q symbol stream is provided to a symbol storage element 618 that temporarily stores half a frame of Q symbols (while the I symbols are decoded). The I symbols are provided to a PAM soft decision computation element 620 that computes the soft decisions for each PAM symbol in a similar manner as computation element 418. The soft decisions from computation element 620 are provided to a Viterbi decoder 622. Viterbi decoder 622 performs maximum-likelihood Viterbi algorithm decoding of the symbol soft decisions in a similar manner to Viterbi decoder 420.

Subsequently, after the half frame of I symbols are decoded, the Q symbols are read from storage element 618 and decoded. This set of operations restores the data to its original order.

The transmitter and receiver embodiment shown in FIGS. 8 and 9 reduces circuit complexity. Only a single pair of encoder and Viterbi decoder is required. This reduction in implementation difficulty is counteracted by an additional increase in delay (a half frame of delay introduced by each of storage elements 514 and 618 for the I and Q symbols, respectively).

OFDM Implementation

Figure 10A:
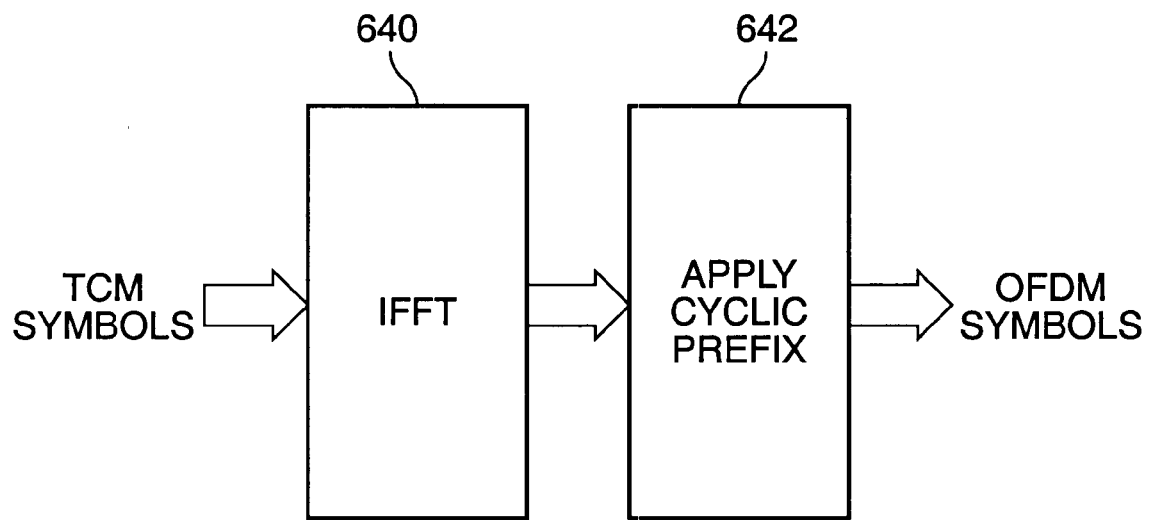
FIGS. 10A–10B depict the use of OFDM with trellis coded modulation according to one embodiment of the present invention.

The I/Q TCM techniques described above may be advantageously combined with orthogonal frequency division multiplexing (OFDM) according to one embodiment of the present invention. FIG. 10A depicts an OFDM processor that may be added to the output of the encoding systems of, e.g., FIG. 2 or FIG. 8 according to one embodiment of the present invention. A segment of N trellis coded modulation symbols is the input to an IFFT processor 640. To assure orthogonalization, a cyclic prefix of v symbols is added by cyclic prefix addition element 642 where v is preferably greater than the duration of the channel impulse response as measured in symbol periods. The cyclic prefix addition process can be characterized by the expression:

$$[z(1) \cdots z(N)]^T \mapsto [z(N-v+1) \cdots z(N)\, z(1) \cdots z(N)]^T$$

Figure 10B:
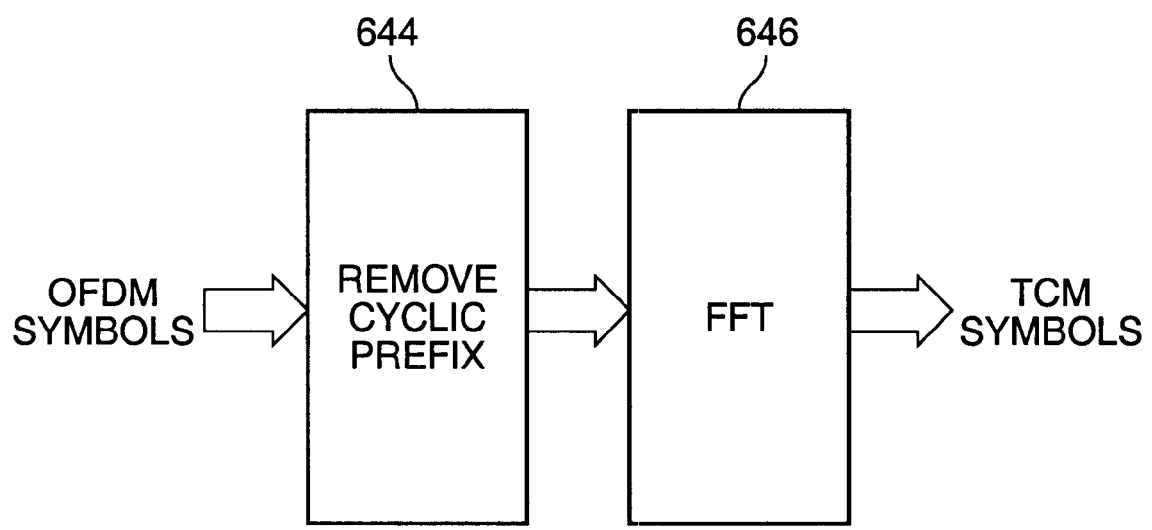

FIG. 10B depicts an OFDM processor that may be added to the input of the decoding systems of, e.g., FIG. 7 or FIG. 9 according to one embodiment of the present invention. A time segment of N+v OFDM symbols is the input to block 644 where the cyclic prefix is removed. Once the cyclic prefix is removed, an FFT processor 646 recovers the trellis coded modulation symbols.

In embodiments where interleaving is used and the convolutional code provides resistance to periodic symbol deletions, the present invention offers great resistance to frequency selective fading. This is because such fading will tend to affect symbols which are adjacent in the time domain at the output of the OFDM demodulator the OFDM processor of FIG. 10A and therefore periodic at the output of deinterleaver 412.

Conclusion

The foregoing description of specific embodiments is provided to enable any person skilled in the art to make or use the present invention. The various modifications to these embodiments will be readily apparent to those skilled in the art, and the generic principles defined herein may be applied to other embodiments without the use of the inventive faculty. For example, other PAM mappings (besides the 8-PAM mapping described above) can be used. Similarly, other modulation schemes (besides the 64-QAM symbols described above) can be used. Examples of other modulation symbols include phase shift keying (PSK) symbol. The systems described herein may of course be implemented in either software or hardware, or any combination thereof. Particular features, including, e.g., interleaving, particular codes, particular code design criteria, particular modulation alphabets, need not be included. Thus, the present invention is not intended to be limited to the embodiments shown herein but is to be accorded the widest scope consistent with the principles and novel features disclosed herein, and as defined by the following claims and their full scope of equivalents.

What is claimed is:

1. A system for providing trellis coded modulation to improve transmission via a channel, said system comprising:
    a convolutional coding system that produces a stream of trellis coded modulation symbols responsive to an input data stream, wherein a first portion of said input data stream is encoded according to a convolutional code to form in-phase components of said trellis coded modulation symbols and a second portion of said input data stream is encoded according to said convolutional code to form quadrature components of said trellis coded modulation symbols, wherein said convolutional code is chosen to optimize performance when said trellis coded modulation symbols are subject to periodic deletion.

2. The system of claim 1 further comprising a puncturing element that intentionally periodically deletes ones of said trellis coded modulation symbols.

3. The system of claim 1 further comprising an OFDM transmission element for forming OFDM symbols from said stream of trellis coded modulation symbols.

4. The system of claim 2 wherein said puncturing element deletes symbols in accordance with a puncturing pattern.

5. The system of claim 4 further comprising:
an interleaver coupled to the modulation element for receiving and reordering said stream of trellis coded modulation symbols.

6. The system of claim 5 wherein an interleaver depth of the interleaver is equal to a number of unpunctured symbols specified per application of said puncturing pattern.

7. The system of claim 5 wherein an interleaver depth of the interleaver and number of unpunctured symbols per application of said puncturing pattern are selected to optimize performance on a Rayleigh fading channel.

8. The system of claim 1 wherein said convolutional code is specified by generators of 172 (octal), 47 (octal), and 137 (octal).

9. The system of claim 2 wherein said convolutional code is specified by generators of 172 (octal), 47 (octal), and 137 (octal) and said puncturing element punctures to rate ½ in accordance with a puncture pattern 110111010.

10. The system of claim 2 wherein said convolutional code is specified by generators of 172 (octal), 47 (octal), and 137 (octal) and said puncturing element punctures to rate ¾ in accordance with a puncture pattern 101010100.

11. The system of claim 1 wherein said convolutional code is specified by generators of 162 (octal), 57 (octal), and 175 (octal).

12. The system of claim 2 wherein said convolutional code is specified by generators of 162 (octal), 57 (octal), and 175 (octal) and wherein said puncturing element punctures to rate ½ in accordance with a puncture pattern 111011100.

13. The system of claim 2 wherein said convolutional code is specified by generators of 162 (octal), 57 (octal), and 175 (octal) and wherein said puncturing element punctures to rate ¾ in accordance with a puncture pattern 101010100.

14. The system of claim 1 wherein said convolutional encoding system comprises:
a first convolutional encoder that receives said first portion of said input data stream and provides a coded inphase data stream;
a second convolutional encoder that receives said second portion of said input data stream and provides a coded quadrature data stream; and
a modulation element coupled to the first and second convolutional encoders that receives the inphase and quadrature data streams and provides as an output said stream of trellis coded modulation symbols.

15. The system of claim 1 wherein said convolutional encoding system comprises:
a convolutional encoder that alternately applies said convolutional code to said first portion and to said second portion of said input data stream to develop said in-phase and quadrature components of said trellis coded modulation symbols; and
a modulation element that combines said in-phase and quadrature components to form said trellis coded modulation symbols.

16. A method for providing trellis coded modulation to improve transmission via a channel comprising:
encoding a first portion of an input data stream to provide an inphase coded data steam and a second portion of said input data stream to provide a quadrature coded data stream according to a convolutional code; and
developing modulation symbols based on said inphase coded data stream and said quadrature coded data stream; and
wherein said convolutional code is chosen to optimize performance when said modulation symbols are subject to periodic deletion.

17. The method of claim 16 further comprising:
periodically deleting ones of said modulation symbols according to a puncturing pattern.

18. The method of claim 16 further comprising interleaving said modulation symbols.

19. A system for decoding a trellis coded modulation signal, said system comprising:
a PAM soft decision system that estimates in-phase and quadrature components of trellis coded modulation symbols; and
a Viterbi decoder system that decodes a convolutional code applied independently to said in-phase and quadrature components,
wherein convolutional code is chosen to optimize performance when said trellis coded modulation symbols are subject to periodic deletion.

20. The system of claim 19 further comprising:
a deinterleaver that reorders said trellis coded modulation symbols to remove applied interleaving.

21. The system of claim 19 further comprising a depuncturer that removes effects of puncturing by indicating locations of punctured symbols to said Viterbi decoder system.

22. A communication transmitter system comprising:
a convolutional coding system that produces a stream of trellis coded modulation symbols responsive to an input data stream, wherein a first portion of said input data stream is encoded according to a convolutional code to form in-phase components of said trellis coded modulation symbols and a second portion of said input data stream is encoded according to said convolutional code to form quadrature components of said trellis coded modulation symbols; and
an OFDM processor that converts a segment of said stream of trellis coded modulation symbols into a burst of OFDM symbols.

23. The communication system of claim 22 wherein said convolutional code is optimized for periodic deletion of said trellis coded modulation symbols.

24. The communication system of claim 22 further comprising an interleaver for receiving and reordering said trellis coded modulation symbols.

25. The communication system of claim 22 further comprising a puncturing element for periodically deleting said trellis coded modulation symbols.

26. A communication receiver system comprising:
an OFDM processor that receives an OFDM burst and converts said OFDM burst to a segment of trellis coded modulation symbols;
a PAM soft decision system that estimates in-phase and quadrature components of said trellis coded modulation symbols; and
a Viterbi decoder system that decodes a convolutional code applied independently to said in-phase and quadrature components.

27. The communication system of claim 26 wherein said convolutional code is optimized for periodic deletion of said trellis coded modulation symbols.

28. The communication system of claim 26 further comprising a deinterleaver that removes an interleaving applied to said trellis coded modulation symbols.

29. The communication system of claim 26 further comprising a depuncturer that removes effects of puncturing by indicating locations of punctured symbols to said Viterbi decoder system.

* * * * *